US006989185B2

(12) United States Patent
Tazawa

(10) Patent No.: US 6,989,185 B2
(45) Date of Patent: Jan. 24, 2006

(54) OPTICAL MEMORY

(75) Inventor: Masato Tazawa, Nagoya (JP)

(73) Assignee: National Institute of Advanced Science and Technology, Tokyo (JP)

( * ) Notice: Subject to any disclaimer, the term of this patent is extended or adjusted under 35 U.S.C. 154(b) by 83 days.

(21) Appl. No.: 10/424,713

(22) Filed: Apr. 29, 2003

(65) Prior Publication Data

US 2003/0206458 A1 Nov. 6, 2003

(30) Foreign Application Priority Data

Apr. 30, 2002 (JP) ............................ 2002-127818

(51) Int. Cl.
*B32B 3/02* (2006.01)

(52) U.S. Cl. ................ 428/64.1; 428/64.4; 430/270.12

(58) Field of Classification Search ............... 428/64.1, 428/64.4, 913; 430/270.12, 495.1, 945
See application file for complete search history.

(56) References Cited

U.S. PATENT DOCUMENTS 4,647,348 A 3/1987 Yamakita et al. ............. 204/59
4,794,130 A 12/1988 Hayakawa et al. ........... 522/33
4,869,795 A 9/1989 Taoda et al. ........... 204/157.15
4,998,239 A * 3/1991 Strandjord et al. ...... 369/275.1
5,053,293 A 10/1991 Yamakita et al. ........... 429/111
5,331,626 A * 7/1994 Sugiura ................... 369/275.1
6,005,838 A * 12/1999 Fan et al. ................ 369/275.1
6,094,413 A * 7/2000 Guerra .................... 369/275.1
6,413,680 B1 * 7/2002 Watanabe et al. .............. 430/5

OTHER PUBLICATIONS

Roger Jansson et al.; A quasi three-dimensional optical memory with n-bit memory cells based on the ellipsometric principle: concept and prototype devices; Optics Communications 104 (1994) pp. 277-279, North-Holland, Jan. 1994.

Roger Jansson et al.; Quasi three-dimensional, n-bit optical memory based on the ellipsometric principle: model calculations; Applied Optics vol. 33, No. 29, pp. 6843-6854, Oct. 1994.

* cited by examiner

*Primary Examiner*—Elizabeth Mulvaney
(74) *Attorney, Agent, or Firm*—Westerman, Hattori, Daniels & Adrian LLP

(57) ABSTRACT

The present invention provides a method of recording information on a memory medium and reading the information, comprising the steps of forming a reflective or transmissive surface having an anisotropic microstructure on a substrate of the memory medium to record information in the microstructure, entering light onto the reflective or transmissive surface, and detecting change in the polarization or intensity of a reflected or transmitted light caused by the microstructure, to read the information. The present invention also provides a memory medium, a production method thereof, and an information reading system.

8 Claims, 14 Drawing Sheets

OPTICAL MEMORY

FIELD OF THE INVENTION

The present invention relates to a new type memory medium obtained by forming a surface having an anisotropic microstructure on a substrate thereof. In particular, the present invention relates to an information recording/reading method capable of providing an increase recording density and recording capacity, wherein the method employs, instead of a conventional process of entering light onto a multilayer film and utilizing a resulting reflected light, a new process of entering light onto a surface having an anisotropic microstructure film as a substitute for the multilayer film and detecting change in the polarization of a resulting reflected or transmitted light. The present invention also relates to a memory medium, a production method thereof and an information reading system.

BACKGROUND OF THE INVENTION

Generally, a conventional optical memory has employed a process of entering light onto a reflective surface formed on a substrate and measuring the intensity of a resulting reflected light to read the information recorded in the reflective surface. For example, as in CDs, there has been used a process of forming a number of microstructures (cells) on a circular rotatable substrate and reducing the size of the microstructure to increase a recording density. Recently, instead of the process as in the CD, there has been proposed a process of entering light onto a multilayer film deposited on a substrate and measuring polarization of a resulting reflected light to read the information recorded in the multilayer film ([1] R. Jansson, H. Arwin, I. Lundstrom, Applied Optics, 33, 6843 (1994), [2] R. Jansson, R. Wigren, K. Jarrendahl, I. Lundstrom, H. Arwin, Optics Communications, 104, 277 (1994)).

The inventors have also proposed a new memory medium using a transparent substrate, characterized by measuring polarization of a transmitted light, instead of a reflected light (Masato Tazawa, Jin Ping, Japanese Patent Application No. 2001-230470). In this process, a typical parameter representing polarization of light is an angle referred to as "ellipsometric parameter" and generally expressed by symbols Δ and Ψ. The polarizations of reflected light and transmitted light are defined by using the following formulas (1) and (2), respectively:

$$\rho=r_p/r_s=\tan\Psi e^{i\Delta} \quad (1),$$

wherein ρ is a complex reflection coefficient ratio, and $r_p$ and $r_s$ are complex reflection coefficients of p-polarization and s-polarization, respectively; and $$\rho=t_p/t_s=\tan\Psi e^{i\Delta} \quad (2),$$

wherein ρ is a complex transmission coefficient ratio, and $t_p$ and $t_s$ are complex transmission coefficients of p-polarization and s-polarization, respectively.

The parameters defining the complex reflection coefficient ratio and the complex transmission coefficient ratio, or the values Δ and Ψ, are determined by the structure of the multilayer film. Thus, the structure of the multilayer film can be learnt by measuring the values Δ and Ψ. That is, it means that if necessary information is formed on the substrate as the structure of the multilayer film in advance, the structure of the multilayer film will function as a memory. Specifically, the information recorded as the structure of the multilayer film can be read by measuring the values Δ and Ψ and subjecting the measured values to appropriate information processing. Based on the above process, a number of microstructures (cells) can be formed on a circular rotatable substrate such as a CD to store information in a high capacity.

FIG. 1 shows one example of a multilayer film structure formed by the conventional process of depositing a multilayer film on a substrate. This structure includes aluminum and molybdenum films having a thickness of 5 nm, and the films are formed on a silicon substrate in a 4-layer structure. In FIG. 1, the aluminum region is shown by a dark gray color, and the molybdenum region is shown by a light gray color. If the aluminum and molybdenum regions are associated, respectively, with 1 and 0 of binary numbers, and the lower layer is defined as a higher bit in advance, the cells will have information such as (0000), (0001), (0010), (0011), (0100), (0101), (0110), (0111) - - - , from the left side of the figure.

Then, the values Δ and Ψ of the cells in the multilayer film can be calculated through a conventional technique for thin film optics, as shown in FIG. 2, wherein the horizontal and vertical axes represent Δ and Ψ, respectively, and each point has the 4-digit binary information specified adjacent thereto. In this example, incident light had an incident angle of 70 degrees and a wavelength of 632.8 nm. Thus, a 4-bit optical memory can be constructed by forming a thin film having the above structure during writing of information, and measuring the values Δ and Ψ and associating them with respective 4-digit binary numbers during reading of the information.

The related technical publications include [1] R. Jansson, H. Arwin, I. Lundstrom, Applied Optics, 33, 6843 (1994), and [2] R. Jansson, R, Wigren, K. Jarrendahl, I. Lundstrom, H. Arwin, Optics Communications, 104, 277 (1994).

The above multilayer film is formed using a thin-film forming method such as a sputtering method or an MBE method. A measurement method of the values Δ and Ψ is known as ellipsometry (see the above publications [1] R. Jansson, H. Arwin, I. Lundstrom, Applied Optics, 33, 6843 (1994), and [2] R. Jansson, R. Wigren, K. Jarrendahl, I. Lundstrom, H. Arwin, Optics Communications, 104, 277 (1994)). The parameter for expressing the polarization is not limited to the values Δ and Ψ, but any other suitable value, such as well known cos Δ and tan Ψ, or two or more kinds of voltage or current values which can be read directly from a detector, may be used.

However, the multilayer film structure employed as an information-recording medium in the conventional optical memory precludes a possibility of producing the optical memory through a stamping process used in producing conventional CDs, which undesirably leads to increased production cost. In addition, incident light has to be entered at an incident angle of about 70 degrees to detect the values Δ and Ψ, and consequently the surface of the memory is irradiated with light having a length three times greater than the beam width of the incident light. Thus, the size of the memory cell cannot be reduced beyond the above length, which undesirably restricts a recording capacity per unit area.

As described above, while the conventional optical memory formed, for example, with a 4-layer film and adapted to read the values Δ and Ψ therefrom can record information in a single cell in 16 of different states, and has a possibility of achieving a high-capacity optical memory, it involves problems of an increased production cost due to inapplicability of the conventional production process, and of restriction in reducing the size of the cell itself.

SUMMARY OF THE INVENTION

In view of the above circumstances, the inventors made various researches for developing a new technology capable of fundamentally solving the problems of the conventional optical memory, and found that an intended goal could be achieved by employing a surface having an anisotropic microstructure as a substitute for the multilayer film in the conventional optical memory. Based on this knowledge, the inventors have finally accomplished the present invention.

It is therefor an object of the present invention to provide a method of forming a surface having an anisotropic microstructure on a substrate to record information therein, entering light onto the surface, and detecting change in the polarization of a reflected light or transmitted light caused by the microstructure, or change in the intensity of a reflected light or transmitted light caused by the microstructure, to read the information, and to provide a memory medium having information recorded through the above method.

It is another object of the present invention to provide a memory structure capable of providing a cell having a reduced size approximately equal to the beam width of an incident light, for example, by entering the incident light vertically.

It is still another object of the present invention to provide a memory medium capable of forming a surface having a microstructure on a substrate through the stamping process used in producing the conventional CDs to achieve a reduced production cost lower than that of the conventional memory medium using the multilayer thin-film structure.

It is yet another object of the present invention to provide a new type high-capacity memory medium and information-recording/reading method capable of simultaneously detecting ellipsometric parameters ($\Delta$ and $\Psi$) and the intensity of a reflected light or transmitted light to allow a recording capacity to be dramatically increased as comparted to the conventional process.

It is yet still another object of the present invention to provide an information recording/reading method, a memory medium and an information reading system capable of detecting only change in the intensity of a reflected light or transmitted light, instead of ellipsometric parameters, to read information.

In order to achieve the above object, according to a first aspect of the present invention, there is provided a method of recording information on a memory medium by means of an anisotropic microstructure and reading the information. The method comprises the steps of forming a reflective surface having the anisotropic microstructure on a substrate to record information therein, entering light onto the reflective surface, and detecting change in the polarization of a reflected light caused by the microstructure, or change in the intensity of a reflected light caused by the microstructure, to read the information.

In the method set forth in the first aspect of the present invention, the change in the polarization of the reflected light caused by the microstructure and the change in the intensity of the reflected light caused by the microstructure may be simultaneously detected.

According to a second aspect of the present invention, there is provided a memory medium for recording information by means of an anisotropic microstructure. The memory medium comprises a reflective surface having an anisotropic microstructure on a substrate to record information therein. In this memory medium, the information is read by entering light onto the reflective surface and detecting change in the polarization of a reflected light caused by the microstructure, or change in the intensity of a reflected light caused by the microstructure.

The memory medium set forth in the second aspect of the present invention may include an optical memory prepared by (1) forming cells with a reflective surface having the anisotropic microstructure, (2) assigning bit data to the cells, and (3) aligning the cells on the substrate.

In the memory medium set forth in the second aspect of the present invention, the change in the polarization of the reflected light caused by the microstructure and the change in the intensity of the reflected light caused by the microstructure may be simultaneously detected.

Further, the reflective surface may include a film made of one or more materials. The reflective surface may include a protective layer.

According to a third aspect of the present invention, there is provided a method of recording information on a memory medium by means of an anisotropic microstructure and reading the information. The method comprises the steps of forming a transmissive surface having the anisotropic microstructure on a substrate to record information therein, entering light onto the transmissive surface, and detecting change in the polarization of a transmitted light caused by the microstructure, or change in the intensity of a transmitted light caused by the microstructure, to read the information.

In the method set forth in the third aspect of the present invention, the change in the polarization of the transmitted light caused by the microstructure and the change in the intensity of the transmitted light caused by the microstructure may be simultaneously detected.

According to a fourth aspect of the present invention, there is provided a memory medium for recording information by means of an anisotropic microstructure. The memory medium comprises a transmissive surface having an anisotropic microstructure on a substrate to record information therein. In this memory medium, the information is read by entering light onto the transmissive surface and detecting change in the polarization of a transmitted light caused by the microstructure, or change in the intensity of a transmitted light caused by the microstructure.

The memory medium set forth in the fourth aspect of the present invention may include an optical memory prepared by (1) forming cells including a transmissive surface having the anisotropic microstructure, (2) assigning bit data to the cells, and (3) aligning the cells on the substrate.

In the memory medium set forth in the fourth aspect of the present invention, the change in the polarization of the transmitted light caused by the microstructure and the change in the intensity of the transmitted light caused by the microstructure may be simultaneously detected.

Further, the transmissive surface may include a film made of one or more materials. The transmissive surface may include a protective layer.

According to a fifth aspect of the present invention, there is provided a method of producing the memory medium for recording information by means of the anisotropic microstructure, set forth in the second aspect of the present invention. The method comprises the steps of (1) forming cells including a reflective surface having the anisotropic microstructure, (2) assigning bit data to the cells, and (3) aligning the cells on the substrate.

According to a sixth aspect of the present invention, there is provided a method of producing the memory medium for recording information by means of the anisotropic microstructure, set forth in the fourth aspect of the present invention. The method comprises the steps of (1) forming cells including a transmissive surface having the anisotropic microstructure, (2) assigning bit data to the cells, and (3) aligning the cells on the substrate.

According to a seventh aspect of the present invention, there is provided an information reading system for reading the information recorded on the memory medium set forth in the second aspect of the present invention. The system comprises the memory medium, and means for optically reading the information recorded on the memory medium. The means is operable to enter light onto the reflective surface of the memory medium and detect change in the polarization of a reflected light caused by the microstructure of the reflective surface and/or change in the intensity of a reflected light caused by the microstructure.

According to an eighth aspect of the present invention, there is provided an information reading system for reading the information recorded on the memory medium set forth in the fourth aspect of the present invention. The system comprises the memory medium, and means for optically reading the information recorded on the memory medium. The means is operable to enter light onto the transmissive surface of the memory medium and detect change in the polarization of a transmitted light caused by the microstructure of the transmissive surface and/or change in the intensity of a transmitted light caused by the microstructure.

DESCRIPTION OF THE PREFERRED EMBODIMENT

The present invention will now be described in more detail.

The present invention relates to a method of forming a surface having an anisotropic microstructure on a substrate to record information in the microstructure, entering light onto the surface, and detecting change in the polarization of a resulting reflected light or transmitted light to read the information. Through the above method, the present invention provides a memory medium having a significantly increased recording capacity as compared to a conventional memory medium such as CDs or DVDs. The present invention also provides a method and system of measuring change in polarization caused when light is reflected by or transmitted through the surface having the anisotropic microstructure to read information recorded in the microstructure.

For example, the present invention uses a method of forming a plurality of microstructures having various anisotropic orientations in association with binary numbers of a plurality of bits to record (write) information in the microstructures, and a method of entering light onto a surface having an anisotropic microstructure and measuring change in the polarization of a resulting reflected light or transmitted light to read out (read) information recorded in the microstructure. In this case, incident light may have, but not limited to, a wavelength of 500 to 900 nm. Further, the incident angle of the incident angle is not limited to a specific value. The term "anisotropic microstructure" herein means a microstructure of a reflective or transmissive surface which is formed on a substrate to have optical anisotropy. The term "substrate" herein has the same meaning as "base" or "base substance", and the substrate may be formed in any suitable shape, such as a plate shape, a cylindrical shape or a drum shape. That is, the substrate is not limited to a specific shape or structure, but may be arbitrarily designed according to intended purposes.

Figure 1:
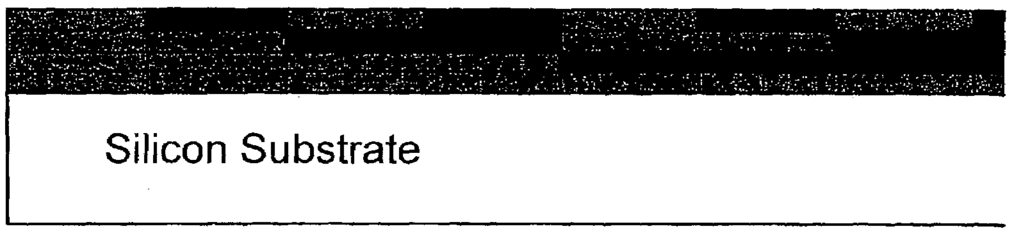
FIG. 1 shows one example of a multilayer film structure having a multilayer film deposited on a substrate in a conventional process.
Figure 2:
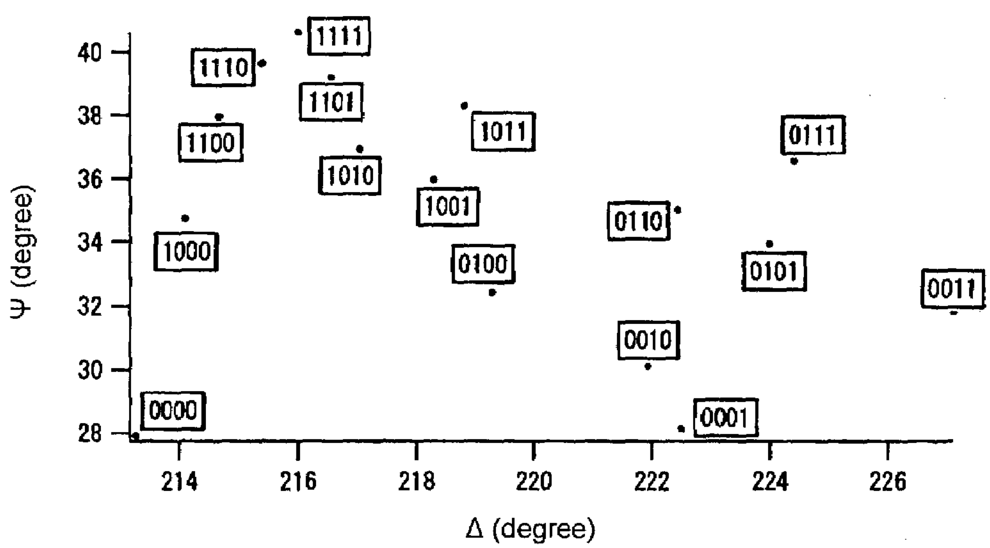
FIG. 2 shows the distribution of Δ and Ψ in the structure of FIG. 1, which is calculated through a conventional technique for thin film optics.
Figure 3:
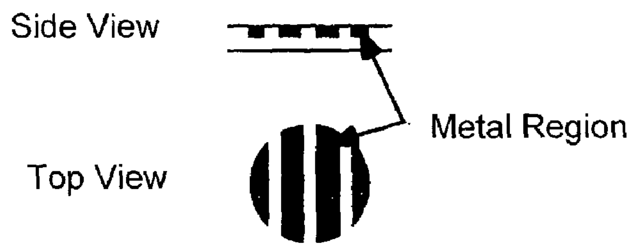
FIG. 3 shows one example of a cell structure of the present invention.

In the present invention, a surface having an anisotropic structure is formed on a substrate. The surface having an anisotropic structure is not limited to a specific shape or structure, but any suitable surface having a non-isotopic microstructure may be used. FIG. 3 shows one example of the above anisotropic microstructure of the present invention. The example in FIG. 3 shows a cell structure with lines each having a given shape, which are formed by embedding metal films as a surface having an anisotropic microstructure in a part of a plastic substrate while maintaining a specific anisotropic orientation of the metal films. In this example, each of the metal films is formed in a rectangular shape having a pair of ends along the circumference of a circle defining one cell. However, the cell is not limited to the circular shape, but it may be formed in any other suitable shape such as a rectangular or square shape. Further, the metal film is not limited to the rectangular shape, but it may be formed in any other suitable shape capable of providing anisotropy as a group of the metal films.

Figure 4:
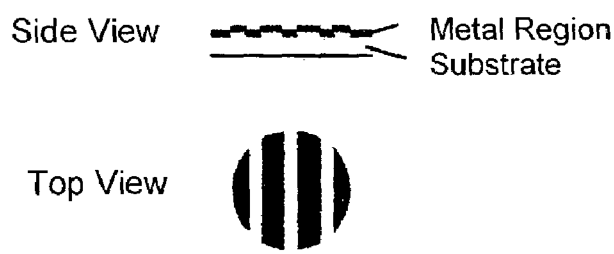
FIG. 4 shows another example of a cell structure of the present invention.

The respective materials of the substrate and the film are not limited to plastic and metal, but they may be made of a pair of any other suitable materials, such as glass and silicon, which have positively different refraction indexes. While the anisotropic microstructure in this example is formed by embedding the metal, it may be any other suitable method, such as a method of forming metal films on a substrate having a microstructure to provide anisotropy, as shown in FIG. 4, or a method of forming a metal film over the surface of a substrate and then removing a part of the metal film. Further, while this example uses the metal microstructure to provide anisotropy, anisotropy may be obtained by any other suitable material, such as an oriented plastic film and optically anisotropic crystals or organic compounds, capable of forming an anisotropic microstructure. In the method of entering light onto the surface having the anisotropic microstructure and detecting change in the polarization of a resulting transmitted light, the substrate is made of a material having a light transmittance, such as a transparent material.

Figure 5:
FIG. 5 shows one example of assignment of 2-bit data to cells each having a microstructure.

In the present invention, the anisotropic orientation of the cell can be arbitrarily changed by varying the inclination of the cell, and bit data can be assigned to a plurality of cells having different anisotropic orientations. FIG. 5 shows one example of assignment of 2-bit data to the cells. While this example shows the assignment of 2-bit data, data to be assigned in the present invention is not limited to 2-bit data, but 3 or more-bit data may be appropriately assigned to cells, for example, by more minutely defining the orientations or varying the width of the metal region and/or the width (pitch) of other region.

The present invention provides a memory medium comprising an optical memory formed by aligning the above cells on a substrate. A master of the memory medium can be produced through the same process as that for conventional CDs, such as a process using laser and photoresist. In this case, photolithography widely used in the field of semiconductors or similar processes may also be used. After the preparation of the master, the memory medium can be produced on a large scale through the same process as that for conventional CDs, and can be subjected to various processing such as surface polishing.

The present invention may be used in combination with a technique of reducing the size of the cell itself to achieve a larger recording capacity. Any suitable conventional technique, such as a technique of reducing the wavelength of irradiation light to allow the cell to be minimized, or a recording method using near-field light, may be used to reduce the size of the cell itself. A technique for forming the surface having the anisotropic microstructure of the present invention is not limited to a specific process or method, and any suitable conventional method or process may be used. In the present invention, the anisotropic microstructure is obtained by forming on a substrate a reflective or transmissive surface made of an optical anisotropic material having a specific anisotropic orientation. While the substrate is preferably formed in a plate shape, a cylindrical shape or a drum shape, as described above, the present invention is not limited to such a shape.

In the present invention, a cell is provided by forming a microstructure having an optical anisotropy on a substrate, preferably by disposing a plurality of lines on a substrate with a given regularity. In this case, the shape and/or pitch of the lines may be arbitrarily designed. In this way, the plurality of cells each having the anisotropic microstructure are formed, and bit data are assigned to the anisotropic orientations of the cells, respectively. The microstructure of the cell surface is not limited to the above structure, but any other suitable structure having an equivalent effect may be used. As above, in the present invention, a reflective or transmissive surface having a given anisotropic microstructure is formed on a substrate. In the present invention, a protective layer may also be formed on the surface or the reflective or transmissive surface, according to need. While the protective layer may be a protective substrate, it is not limited to a specific shape or type.

The present invention provides an information reading system of reading information recorded on the above memory medium including a reflective surface having an anisotropic microstructure. The information reading system comprises the memory medium, and means for optically reading the information recorded on the memory medium. The reading means is operable to enter light onto the reflective surface of the memory medium and detect change in the polarization of a reflected light caused by the microstructure of the reflective surface and/or change in the intensity of a reflected light caused by the microstructure of the reflective surface.

The present invention also provides an information reading system of reading information recorded on the above memory medium including a transmissive surface having an anisotropic microstructure. The information reading system comprises the memory medium, and means for optically reading the information recorded on the memory medium. The reading means is operable to enter light onto the transmissive surface of the memory medium and detect change in the polarization of a transmitted light caused by the microstructure of the transmissive surface and/or change in the intensity of a transmitted light caused by the microstructure of the transmissive surface. The reading means is not limited to a specific structure, but any suitable device having the above function may be designed according to intended purposes.

According to the present invention, information can be recorded (written) by forming the reflective surface having the anisotropic microstructure on a substrate, and the recorded information can be read out (read) by entering light onto the reflective surface and detecting change in the polarization of a resulting reflected light. Further, information can be recorded (written) by forming the transmissive surface having the anisotropic microstructure on a substrate, and the recorded information can be read out (read) by entering light onto the transmissive surface and detecting change in the polarization of a resulting transmitted light. In the above cases, change in the intensity of a reflected light caused by the microstructure may be detected independently of or simultaneously with the detection of change in the polarization of the reflected light caused by the microstructure, or change in the intensity of a transmitted light caused by the microstructure may be detected independently of or simultaneously with the detection of change in the polarization of the transmitted light caused by the microstructure, to achieve a drastically increased recording capacity.

While the present invention will be specifically described below in connection with various examples, the present invention is not limited to the following examples.

EXAMPLE 1

Figure 6:
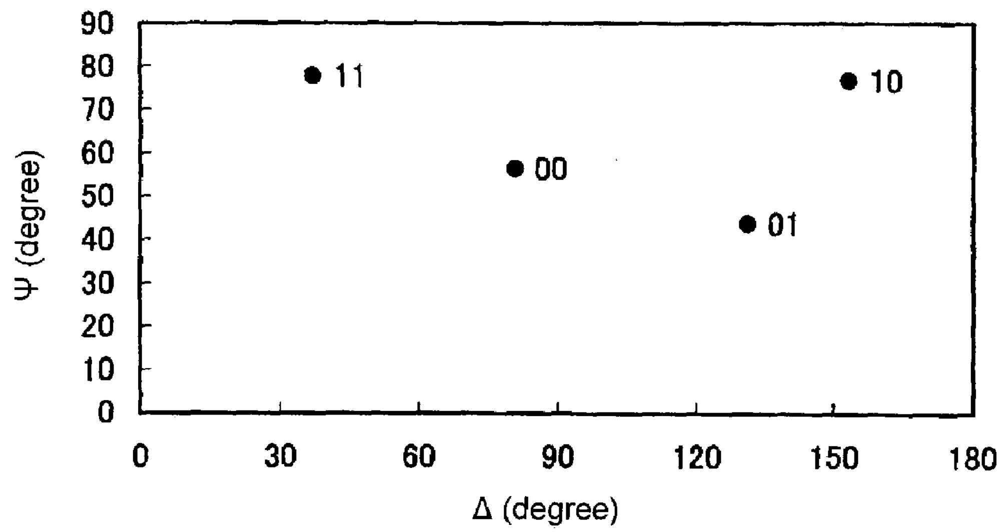
FIG. 6 shows the measured values of Δ and Ψ in a diffraction grating, wherein incident light is linear polarized light of which the electric field vas set at 60 degrees relative to the plane of incidence and a wavelength of 500 nm.

A commercially available diffraction grating of 300 lines was used as a sample having an anisotropic microstructure, and the values Δ and Ψ were measured while changing the direction of lines of the diffraction gating. A VASE type rotary analyzer ellipsometer (available from JA Woollam Co., Inc.) was used as a measuring apparatus. Incident light was linear polarized light, and the direction of an electric field vector of the incident light was set at 60 degrees relative to the plane of incidence which comprises the incident light beam and the direction normal to the sample. The values Δ and Ψ measured using an incident light having a wavelength of 500 nm are shown in FIG. 6.

The direction of the lines of the diffraction gating was set at 0, 45, 68 and 90 degrees relative to the incident surface. The directions were associated, respectively, with binary numbers of 00, 01, 10 and 11, and the binary numbers were described adjacent to corresponding measurement points, in FIG. 6. FIG. 6 shows that the error in each of the measured values Δ and Ψ is a few degrees at most, and the measurement points are sufficiently separated from each other. This measurement result verifies that 2-bit binary numbers can be expressed by the direction of a diffractive grating.

EXAMPLE 2

Figure 7:
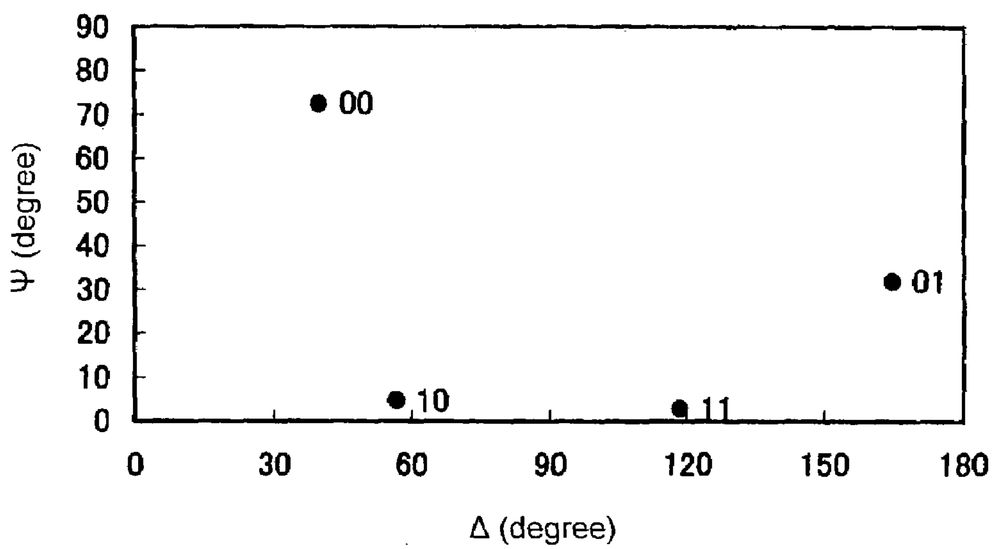
FIG. 7 shows the measured values of Δ and Ψ in a diffraction grating, wherein incident light is linear polarized light of which the electric field vas set at 60 degrees relative to the plane of incidence and a wavelength of 800 nm.

In the same manner as that in EXAMPLE 1, the values Δ and Ψ measured using an incident light having a wavelength of 800 nm are shown in FIG. 7. This measurement result verifies that the method of the present invention can be implemented even if an incident light having a wavelength other than 500 nm is used.

EXAMPLE 3

Figure 8:
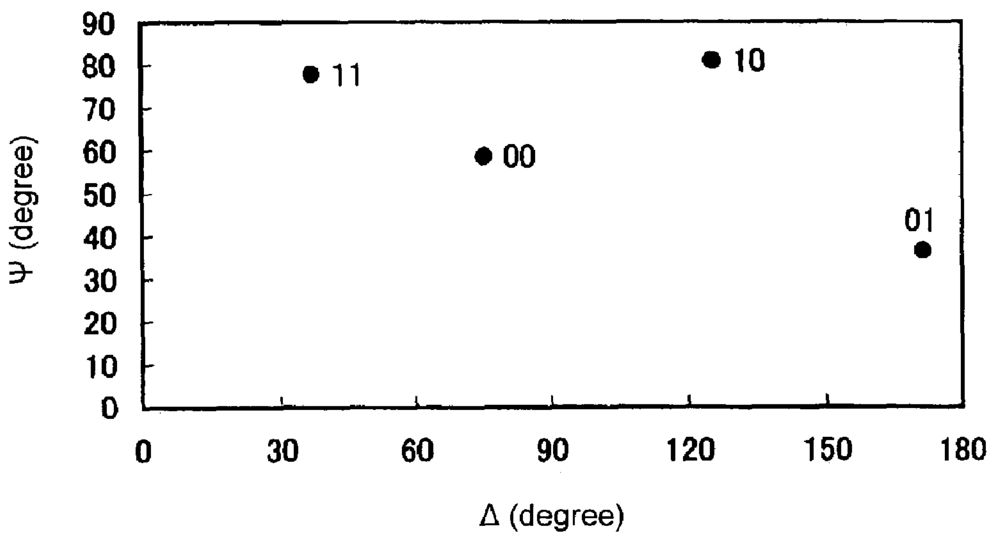
FIG. 8 shows the measured values of Δ and Ψ in a diffraction grating, wherein incident light is linear polarized light of which the electric field vas set at 45 degrees relative to the plane of incidence and a wavelength of 500 nm.
Figure 9:
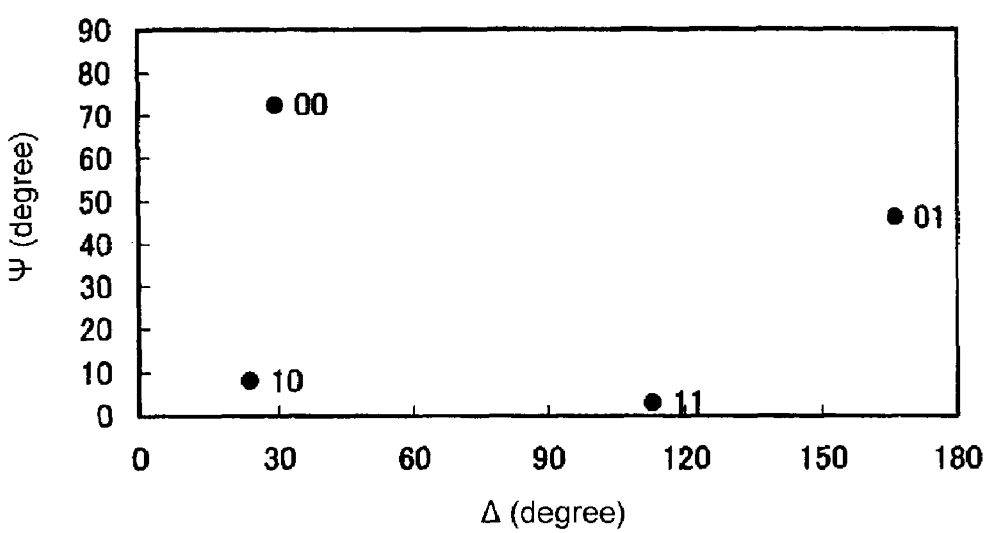
FIG. 9 shows the measured values of Δ and Ψ in a diffraction grating, wherein incident light is linear polarized light of which the electric field vas set at 45 degrees relative to the plane of incidence and a wavelength of 800 nm.
Figure 10:
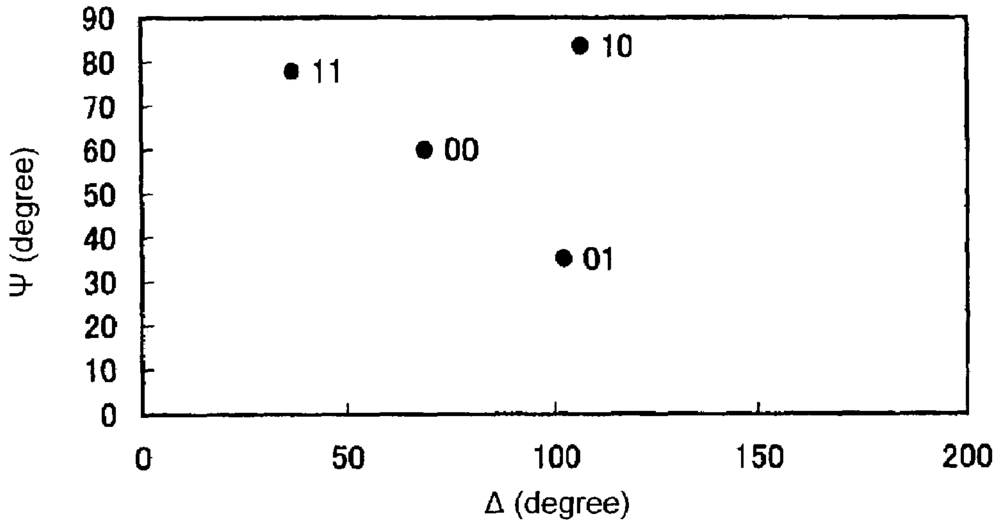
FIG. 10 shows the measured values of Δ and Ψ in a diffraction grating, wherein incident light is linear polarized light of which the electric field vas set at 30 degrees relative to the plane of incidence and a wavelength of 500 nm.
Figure 11:
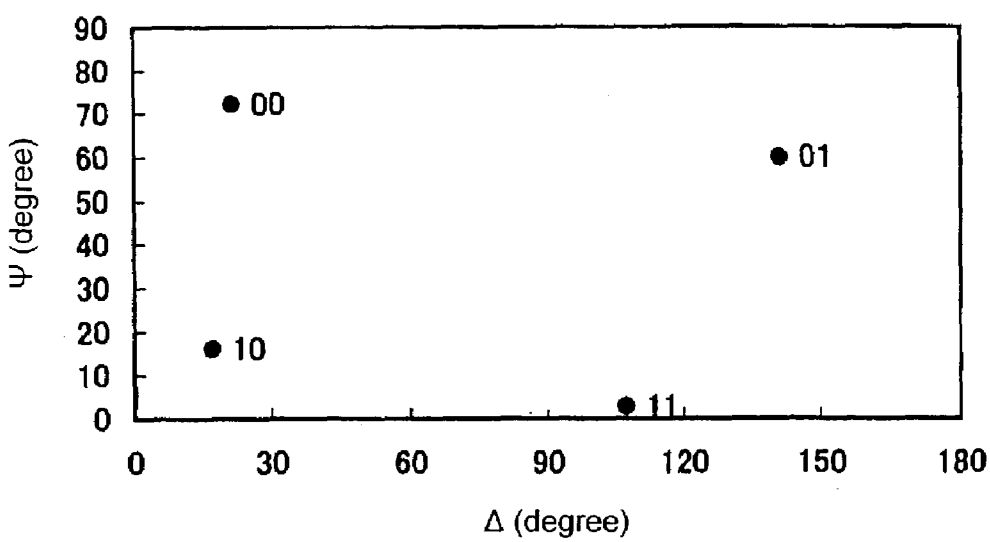
FIG. 11 shows the measured values of Δ and Ψ in a diffraction grating, wherein incident light is linear polarized light of which the electric field vas set at 30 degrees relative to the plane of incidence and a wavelength of 800 nm.
Figure 12:
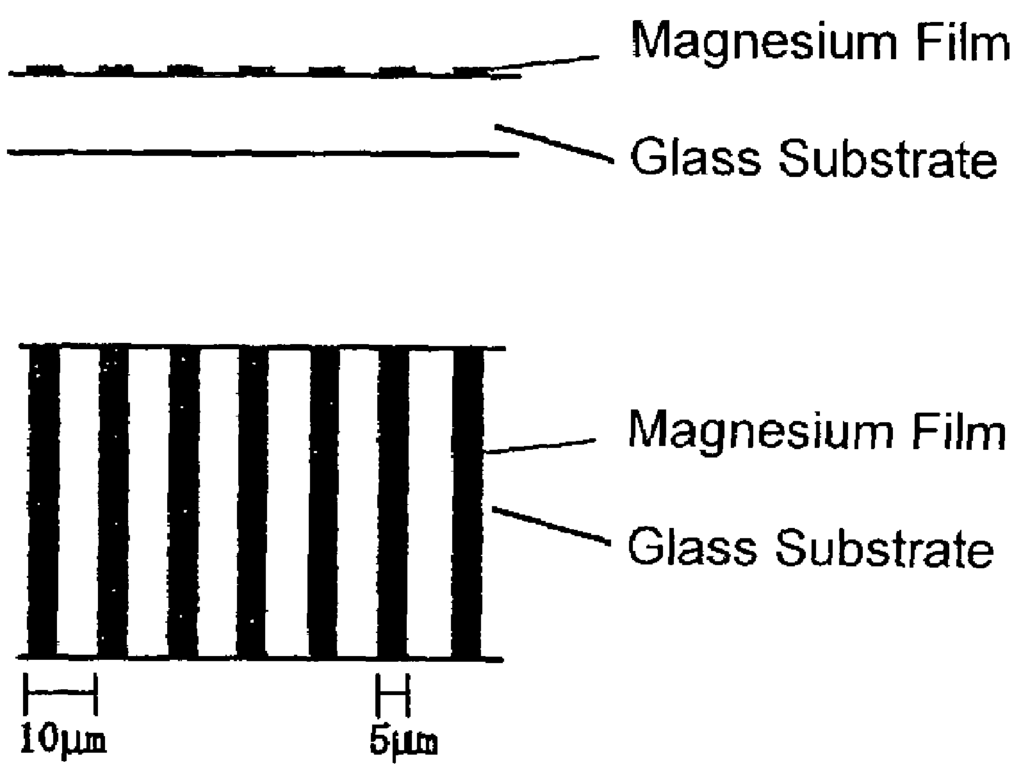
FIG. 12 shows one example of a cell microstructure of the present invention.

In the same manner as those in EXAMPLEs 1 and 2, the values Δ and Ψ measured using incident lights having an electric field vector set at a direction of 45 degrees relative to the plane of incidence, and wavelengths of 500 nm and 800 nm are shown in FIGS. 8 and 9, respectively. The values Δ and Ψ measured using incident lights having an electric field vector set at a direction of 30 degrees relative to the plane of incidence, and wavelengths of 500 nm and 800 nm are shown in FIGS. 10 and 11, respectively. These measurement results verify that the method of the present invention can be implemented even if the polarization of an incident light is changed.

EXAMPLE 4

Figure 13:
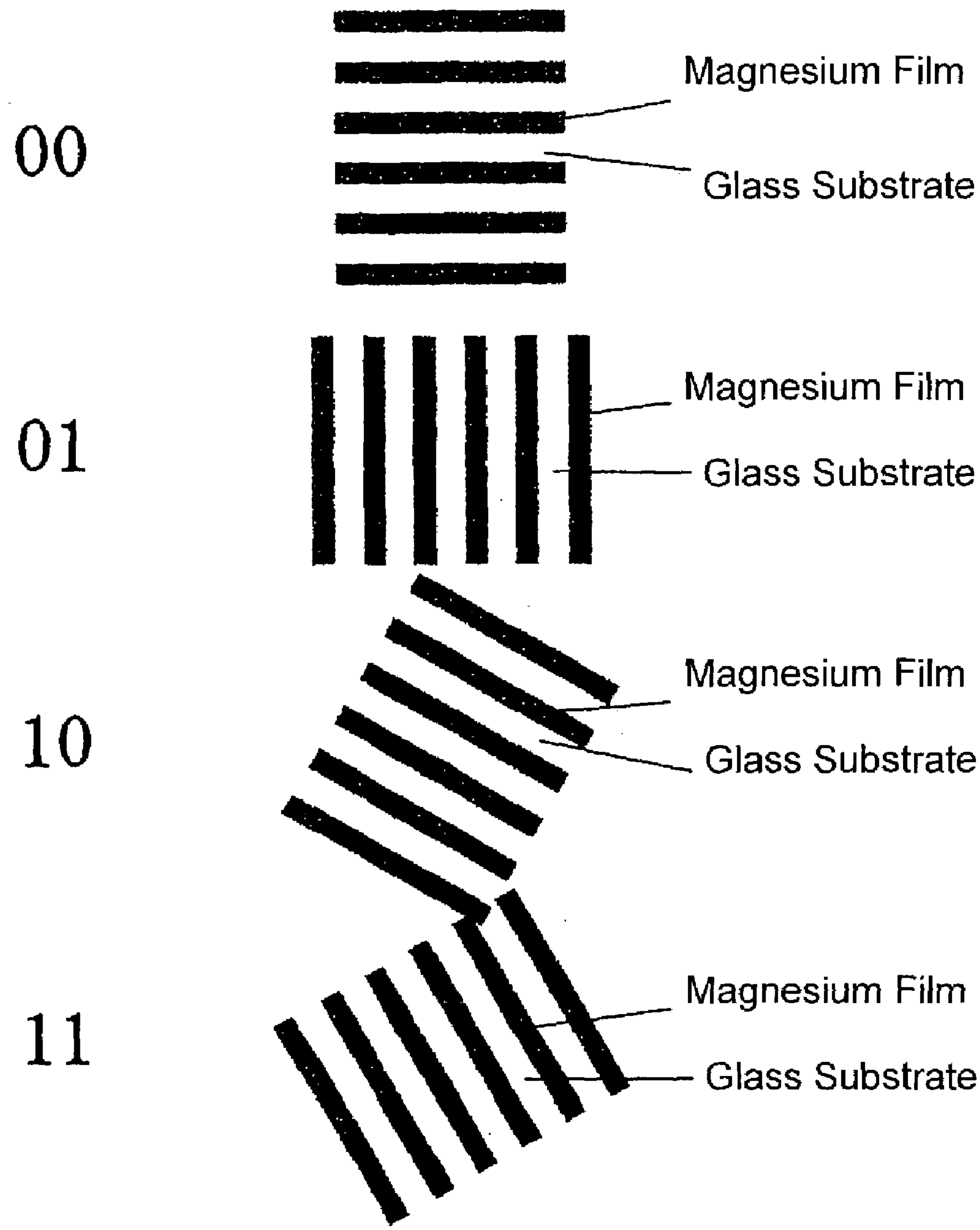
FIG. 13 shows one example of assignment of 2-bit data to cell microstructures of the present invention.

A magnesium thin film was formed on a glass substrate at a thickness of 220 nm through sputtering, and then 50 lines of 5 μm were drawn at 10 μm pitches by a laser processing machine. The lines were drawn in the range of 0.5 mm×0.5 mm. 2-bit data are assigned to the respective directions of the microstructures, as shown in FIG. 13, and the values Δ and Ψ were measured at an incident angle of 60 degrees by an M 2000 ellipsometer (available from JA Woollam Co., Inc.). As shown by the measurement result in FIG. 14, points in the Δ-Ψ plane could be associated with the 2-bit data. A measurement wavelength was set at 1000 nm. The error in each of the measured values Δ and Ψ is 0.5 degree or less, and these points can be readily discriminated.

Then, information was recorded by notching lines having the same pitch and width as above on a magnesium thin film having the same thickness as above by a laser processing machine. The recorded information was alphabets "AIST" corresponding to ASCII codes of 41, 49, 53 and 54. When described by binary numbers, these alphabets will be 8-bit data of 01000001, 01001001, 01010011 and 01010100, respectively.

Figure 15:
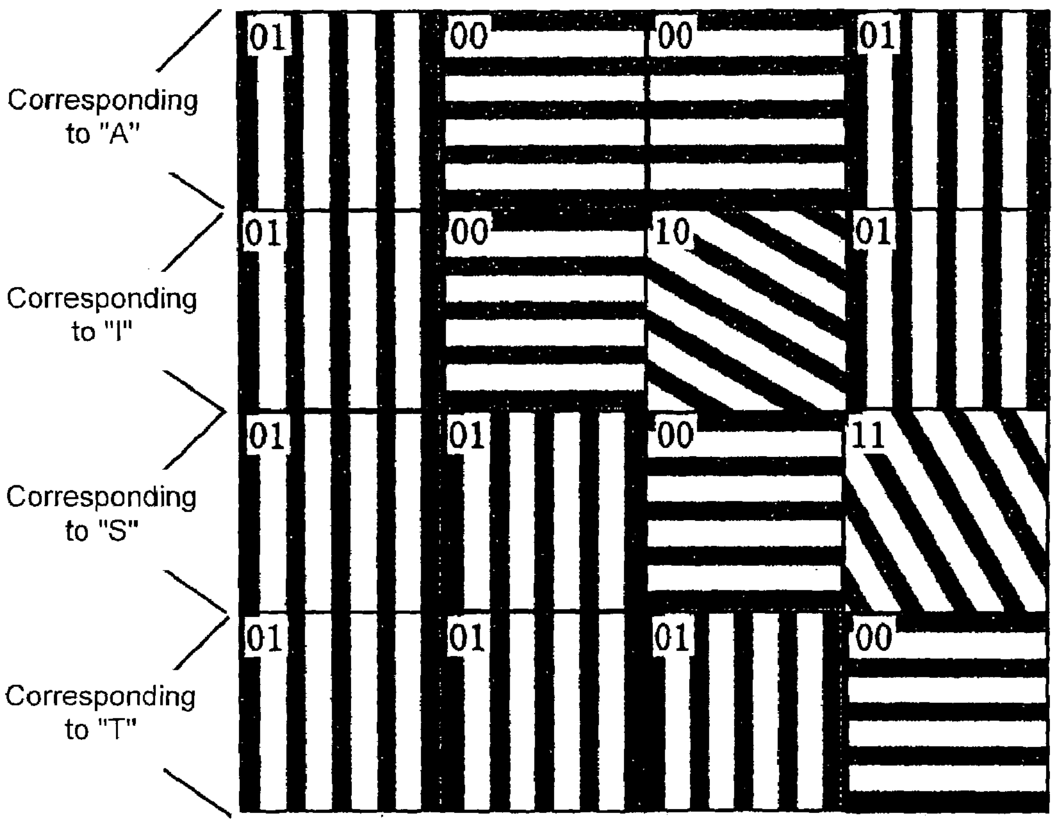
FIG. 15 shows one example of information recorded on a glass substrate, wherein the information is recorded as 2-bit data per cell to express "AIST" with ASCII codes.

In EXAMPLE 4, it is necessary to have 4 cells per character or 16 cells in total because 2-bit data can be recorded in each of the cells. Thus, 16 cells each having an area of 0.5 mm×0.5 mm were formed in the area 2 mm×2 mm of the magnesium thin film, and the information of the above binary numbers were recorded, respectively, in the cells, as shown in FIG. 15. In FIG. 15, the direction of each of the microstructures is illustrated at lager pitches than actual pitches, and the 2-bit data are described on the upper left of each of the corresponding cells.

Figure 16:
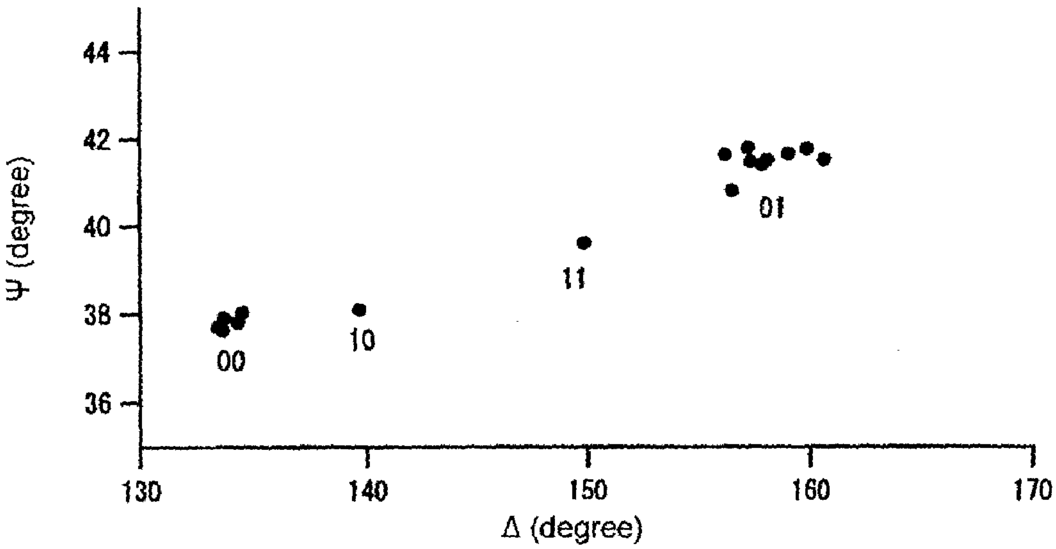
FIG. 16 shows read data of the information in FIG. 15, wherein incident light has an incident angle of 60 degrees and a wavelength of 1000 nm.

The measured values of Δ and Ψ in each of the cells are shown in FIG. 16. The recorded 2-bit data could be read by comparing the measured values in FIG. 16 to the measured values in FIG. 14. The number 5 of the data 00, the number 9 of data 01, the number 1 of data 10 and the number 1 of data 11 could be precisely discriminated. Further, the recorded information could be identified as the alphabets "AIST" by referring to ASCII codes.

EXAMPLE 5

Figure 14:
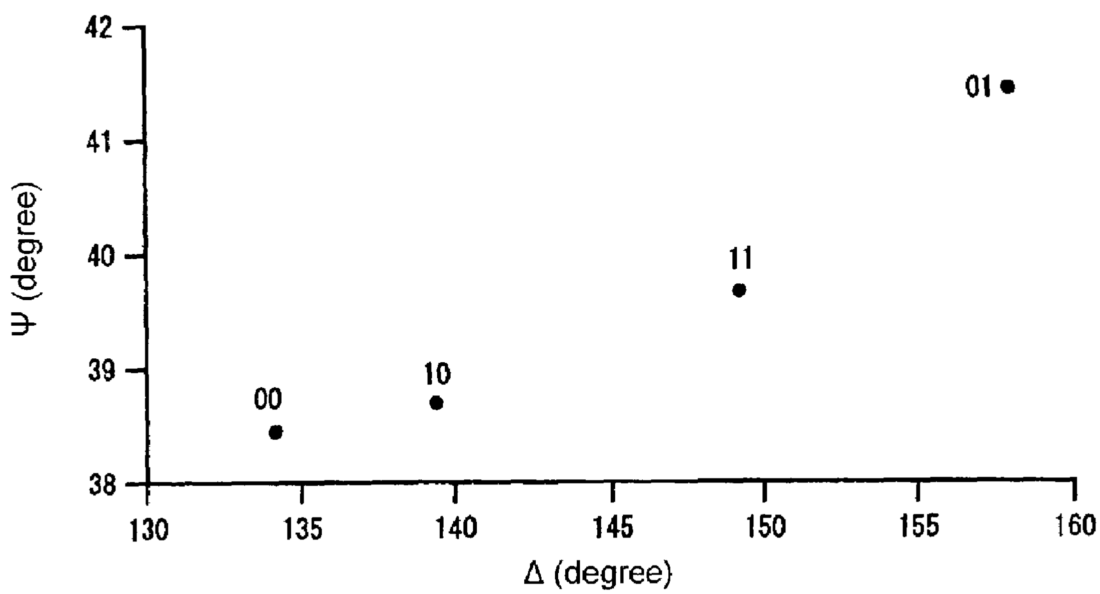
FIG. 14 shows the measured values of Δ and Ψ in the cells of FIG. 13, wherein incident light has an incident angle of 60 degrees and a wavelength of 1000 nm.
Figure 17:
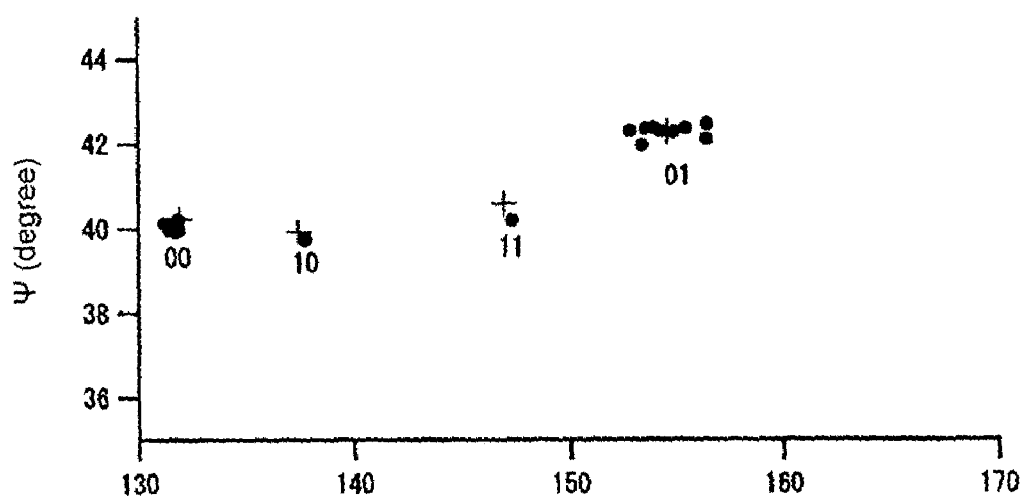
FIG. 17 shows read data of the information in FIG. 15, wherein incident light has an incident angle of 60 degrees and a wavelength of 900 nm, and the marks + show measured data obtained by rotating one cell in FIG. 12.

In the same manner as that in EXAMPLE 4 except 6 cells which were not processed, information was recorded in a magnesium thin film, and the recorded information was read. A measurement wavelength was set at 900 nm. The measurement result is shown in FIG. 17. In FIG. 17, points corresponding to those in FIG. 14 are illustrated by marks +. This measurement result verifies that information can be recorded and read even if the wavelength is set at 900 nm.

EXAMPLE 6

Figure 19:
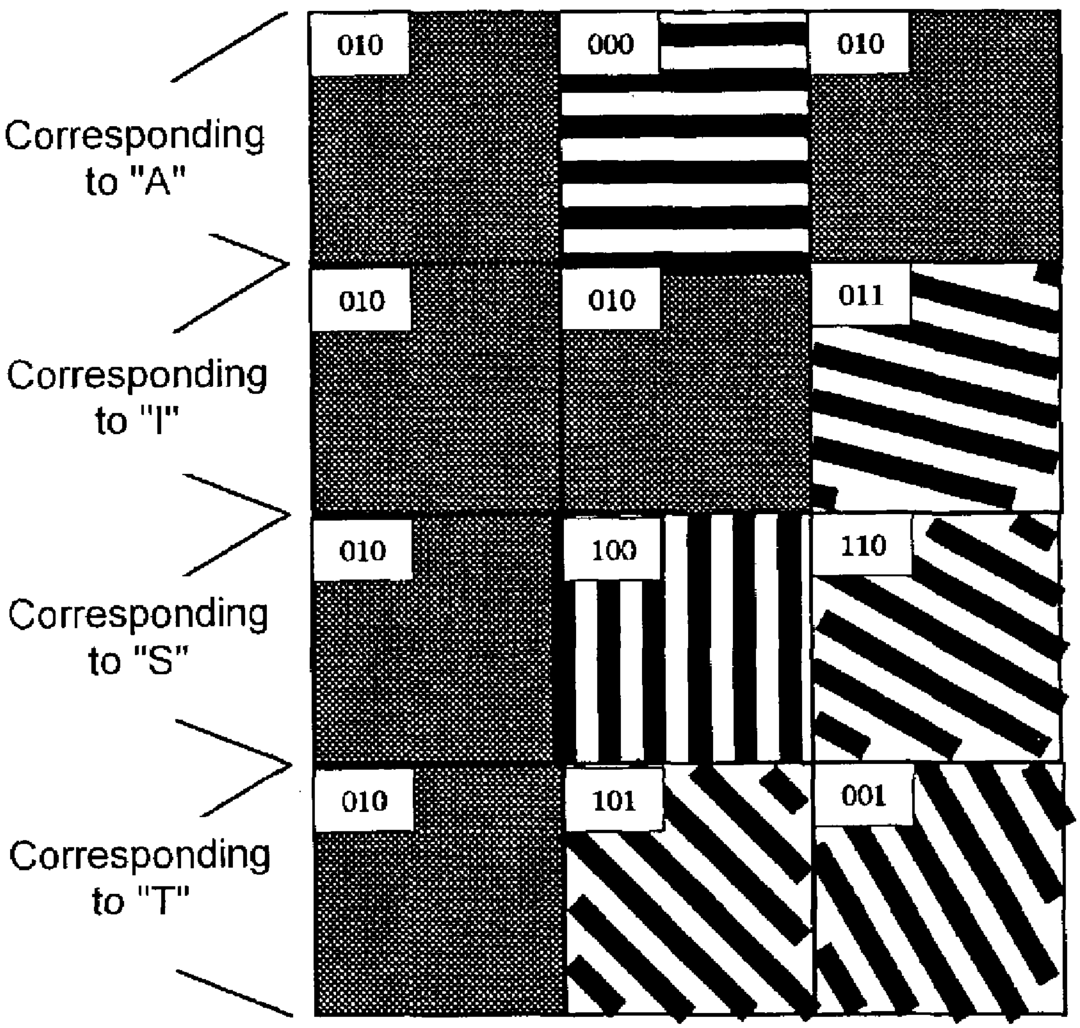
FIG. 19 shows still another example of information recorded on a glass substrate, wherein the information is recorded as 3-bit data per cell.
Figure 20:
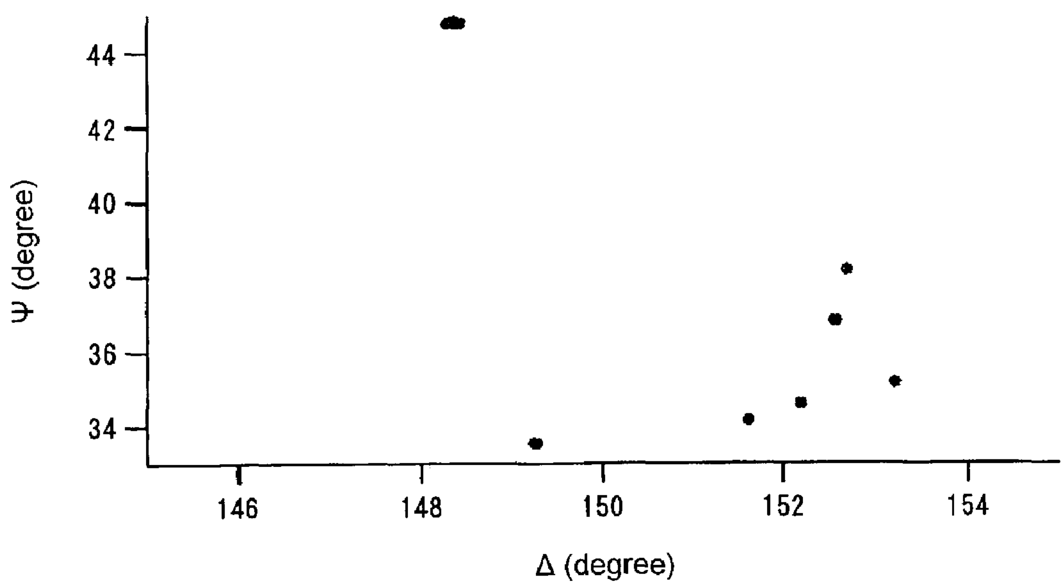
FIG. 20 shows read data of the information written in FIG. 19.

In the same manner as that in EXAMPLE 4, a silver thin film was formed on a glass substrate, and alphabets "AIST" were recorded as shown in FIG. 19. In EXAMPLE 6, 3-bit data was recorded for each of cells, and 3 cells were used for each of the characters. 8 bits are necessary for each of the characters. Thus, the remaining last 1 bit was used for parity check. Specifically, binary numbers of 010000010, 010010011, 010100110 and 010101001 were recorded for the characters of A, I, S and T, respectively. The values of Δ and Ψ measured using an incident light having a wavelength of 800 nm are shown in FIG. 20. As compared to measurement errors, measured points were sufficiently separated from each other, and could be read. This measurement result verifies that the method of the present invention allows 3-bit data to be recorded in a single cell.

EXAMPLE 7

Figure 21:
FIG. 21 shows a lattice structure formed through a laser processing.

An aluminum thin film having a thickness of about 100 nm was deposited on a glass substrate through a magnetron sputtering method, and a lattice structure as shown in FIG. 21 was formed in the area 0.5 mm×0.5 mm of the thin film through a laser processing. The aluminum thin film was formed to have the following 8 kinds of the pitches and aluminum widths.

Figure 22:
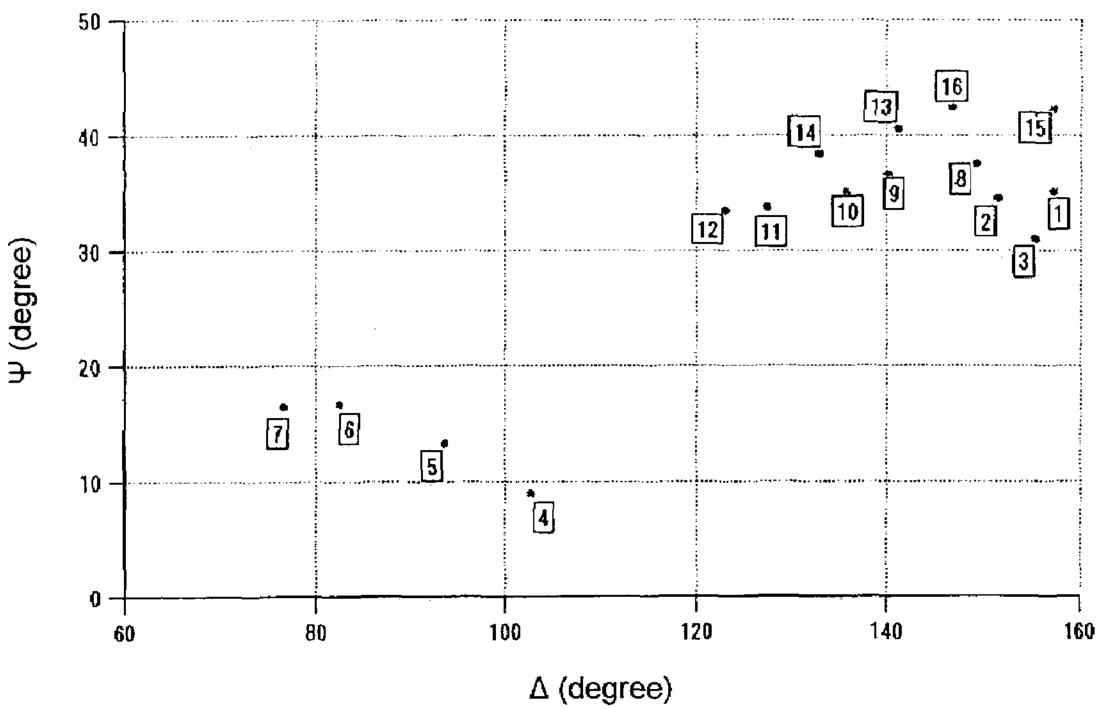
FIG. 22 shows the positions of selected 16 points.

(1) pitch: 10 micrometer, aluminum width: 5 micrometer (2) pitch: 20 micrometer, aluminum width: 15 micrometer (3) pitch: 30 micrometer, aluminum width: 25 micrometer (4) pitch: 50 micrometer, aluminum width: 45 micrometer (5) pitch: 10 micrometer, aluminum width: 1 micrometer or less (6) pitch: 20 micrometer, aluminum width: 10 micrometer (7) pitch: 30 micrometer, aluminum width: 20 micrometer (8) pitch: 50 micrometer, aluminum width: 40 micrometer By using these samples, the values Δ and Ψ were measured while changing the longitudinal direction of the remained aluminum lines relative to the plane of incidence. These measured values were plotted as points on one sheet of graph having a horizontal axis representing the value Δ and a vertical axis representing the value Ψ, and 16 points having a relatively wide distance to adjacent points were selected. The data of the selected points are shown in Table 1, and the graph of the data is shown in FIG. 22. These points are sufficiently spaced apart from each other, and can be distinguished from each other in the measurement using a conventional ellipsometer. This measurement results verifies that the method of the present invention allows 16 numerical values or 4 bits to be recorded for each of cells.

TABLE 1

| NO | Pitch | Aluminum Width | Angle with Incident surface | Δ | Ψ |
|---|---|---|---|---|---|
| 1 | 10 | 5 | 0 | 157.3 | 35.2 |
| 2 | 10 | 5 | 30 | 151.6 | 34.6 |
| 3 | 10 | 5 | 90 | 155.4 | 31.0 |
| 4 | 10 | <1 | 0 | 102.6 | 8.9 |
| 5 | 10 | <1 | 30 | 93.6 | 13.3 |
| 6 | 10 | <1 | 60 | 82.4 | 16.7 |
| 7 | 10 | <1 | 90 | 76.6 | 16.5 |
| 8 | 20 | 15 | 60 | 149.4 | 37.5 |
| 9 | 20 | 10 | 0 | 140.1 | 36.6 |
| 10 | 20 | 10 | 30 | 135.9 | 35.1 |
| 11 | 20 | 10 | 60 | 127.5 | 33.8 |
| 12 | 20 | 10 | 90 | 123.1 | 33.5 |
| 13 | 30 | 20 | 0 | 141.3 | 40.5 |
| 14 | 30 | 20 | 90 | 133.1 | 38.4 |
| 15 | 50 | 45 | 0 | 157.2 | 42.2 |
| 16 | 50 | 40 | 0 | 146.8 | 42.5 |

Comparative Example

Figure 18:
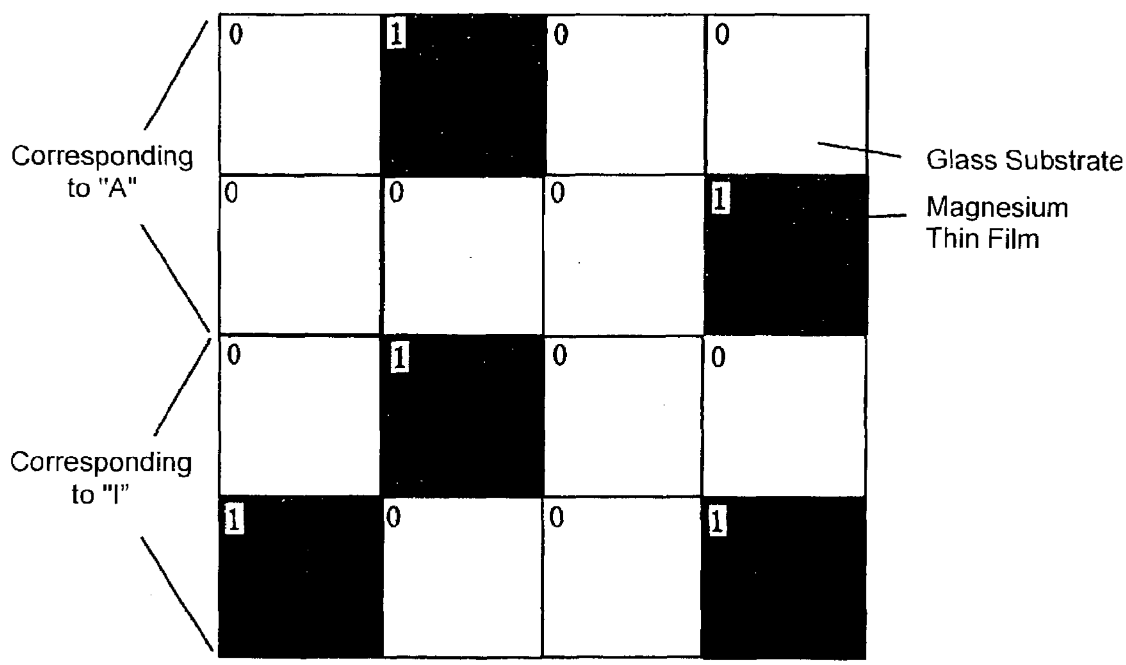
FIG. 18 shows another example of information recorded on a glass substrate, wherein the information is recorded as 1-bit data per cell to express "AI" with ASCII codes.

Cells each having the same size and thickness as those in EXAMPLE 4 were formed. A comparative example was prepared by forming a magnesium thin film only on some of the cells and forming no magnesium thin film on the remaining cells. Then, 1-bit data was stored in 16 cells as shown in FIG. 18. As a result, only two characters "AI" could be recorded and read even if the 16 cells were used.

As mentioned above in detail, the present invention is directed to a new type high-capacity memory medium structure obtained by forming a surface having an anisotropic microstructure on a substrate thereof. According to the present invention, the following effects can be obtained.

(1) A memory medium and an information reading system employing a new process using a surface having an anisotropic microstructure, as a substitute for a multilayer film as in a conventional process, can be provided.

(2) The recording density on a memory medium can be increased by using a process of entering light onto the surface having the anisotropic microstructure and detecting change in the polarization of a resulting reflected light or transmitted light, to allow a high-capacity memory medium to be produced and provided.

(3) A memory structure having a reduced cell size approximately equal to the beam width of incident light can be provided by entering the incident light vertically.

(4) The anisotropic microstructure can be formed through a stamping process used in producing conventional CDs. Thus, a production cost can be reduced as compared to that of the conventional memory medium using the multilayer film structure.

(5) A recording capacity can be drastically increased by detecting the intensity of the reflected light or transmitted light simultaneously with the detection of the ellipsometric parameters.

What is claimed is:

1. A method of recording information on a memory medium by means of an anisotropic microstructure and reading said information, said method comprising the steps of:

forming a reflective surface having said anisotropic microstructure on a substrate to record information therein:

entering light onto said reflective surface; and detecting change in the polarization of a reflected light caused by said microstructure, or change in the intensity of a reflected light caused by said microstructure, to read said information, wherein said change in the polarization of the reflected light caused by said microstructure and said change in the intensity of the reflected light caused by said microstructure are simultaneously detected.

2. A memory medium for recording information by means of an anisotropic microstructure, said memory medium comprising a reflective surface having an anisotropic microstructure on a substrate to record information therein, wherein said information is read by entering light onto said reflective surface and detecting change in the polarization of a reflected light caused by said microstructure, or change in the intensity of a reflected light caused by said microstructure, said memory medium including an optical memory prepared by:

(1) forming cells with a reflective surface having said anisotropic microstructure;

(2) assigning bit data to said cells; and (3) aligning said cells on said substrate.

3. A memory medium for recording information by means of an anisotropic microstructure, said memory medium comprising a reflective surface having an anisotropic microstructure on a substrate to record information therein, wherein said information is read by entering light onto said reflective surface and detecting change in the polarization of a reflected light caused by said microstructure, or change in the intensity of a reflected light caused by said microstructure, wherein said change in the polarization of the reflected light caused by said microstructure and said change in the intensity of the reflected light caused by said microstructure are simultaneously detected.

4. A method of recording information on a memory medium by means of an anisotropic microstructure and reading said information, said method comprising the steps of:

forming a transmissive surface having said anisotropic microstructure on a substrate to record information therein;

entering light onto said transmissive surface; and detecting change in the polarization of a transmitted light caused by said microstructure, or change in the intensity of a transmitted light caused by said microstructure, to read said information, wherein said change in the polarization of the transmitted light caused by said microstructure and said change in the intensity of the transmitted light caused by said microstructure are simultaneously detected.

5. A memory medium for recording information by means of an anisotropic microstructure, said memory medium comprising a transmissive surface having an anisotropic microstructure on a substrate to record information therein, wherein said information is read by entering light onto said transmissive surface and detecting change in the polarization of a transmitted light caused by said microstructure, or change in the intensity of a transmitted light caused by said microstructure, said memory medium including an optical memory prepared by:

(1) forming cells including a transmissive surface having said anisotropic microstructure;

(2) assigning bit data to said cells; and (3) aligning said cells on said substrate.

6. A memory medium for recording information by means of an anisotropic microstructure, said memory medium comprising a transmissive surface having an anisotropic microstructure on a substrate to record information therein, wherein said information is read by entering light onto said transmissive surface and detecting change in the polarization of a transmitted light caused by said microstructure, or change in the intensity of a transmitted light caused by said microstructure, wherein said change in the polarization of the transmitted light caused by said microstructure and said change in the intensity of the transmitted light caused by said microstructure are simultaneously detected.

7. A method of producing a memory medium comprising the steps of:

forming a plurality of cells each including a reflective surface having an anisotropic microstructure;

assigning bit data to said cells; and aligning said cells on a substrate of said memory medium.

8. A method of producing a memory medium comprising the steps of:

forming a plurality of cells each including a transmissive surface having an anisotropic microstructure;

assigning bit data to said cells; and aligning said cells on a substrate of said memory medium.

* * * * *